(12) United States Patent
Ma et al.

(10) Patent No.: US 10,862,074 B2
(45) Date of Patent: Dec. 8, 2020

(54) MANUFACTURING FLEXIBLE ORGANIC ELECTRONIC DEVICES

(71) Applicant: UNIVERSAL DISPLAY CORPORATION, Ewing, NJ (US)

(72) Inventors: Ruiqing Ma, Morristown, NJ (US); Jeff Silvernail, Yardley, PA (US); Prashant Mandlik, Lawrenceville, NJ (US); Julia J. Brown, Yardley, PA (US); John Felts, Alameda, CA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/459,044

(22) Filed: Mar. 15, 2017

(65) Prior Publication Data

US 2017/0187006 A1 Jun. 29, 2017

Related U.S. Application Data

(62) Division of application No. 13/716,448, filed on Dec. 17, 2012.

(51) Int. Cl.
*H01L 51/56* (2006.01)
*H01L 51/00* (2006.01)
(Continued)

(52) U.S. Cl.
CPC ............ *H01L 51/56* (2013.01); *H01L 51/001* (2013.01); *H01L 51/0021* (2013.01);
(Continued)

(58) Field of Classification Search
CPC .............. H01L 51/001; H01L 51/0021; H01L 51/0029; H01L 51/0097; H01L 51/5212;
(Continued)

(56) References Cited

U.S. PATENT DOCUMENTS 3,510,349 A * 5/1970 Jones .................... C23C 14/042
118/504
3,748,090 A * 7/1973 Ciuffini ................. C23C 14/243
432/263

(Continued)

FOREIGN PATENT DOCUMENTS

| WO | WO-2008057394 A1 | 5/2008 |
| WO | WO-2010011390 A2 | 1/2010 |
| WO | WO-2011007480 A1 | 1/2011 |

OTHER PUBLICATIONS

Baldo, et al., "Highly efficient phosphorescent emission from organic electroluminescent devices", Nature, vol. 395, pp. 151-154, 1998.
(Continued)

*Primary Examiner* — Brian K Talbot
(74) *Attorney, Agent, or Firm* — Butzel Long

(57) ABSTRACT

A method of forming microelectronic systems on a flexible substrate includes depositing a plurality of layers on one side of the flexible substrate. Each of the plurality of layers is deposited from one of a plurality of sources. A vertical projection of a perimeter of each one of the plurality of sources does not intersect the flexible substrate. The flexible substrate is in motion during the depositing the plurality of layers via a roll to roll feed and retrieval system.

12 Claims, 13 Drawing Sheets

(51) Int. Cl.
*H01L 51/52* (2006.01)
*C23C 14/24* (2006.01)
*C23C 14/00* (2006.01)
*C23C 14/04* (2006.01)

(52) U.S. Cl.
CPC ...... *H01L 51/0029* (2013.01); *H01L 51/0097* (2013.01); *H01L 51/5212* (2013.01); *C23C 14/0078* (2013.01); *C23C 14/04* (2013.01); *C23C 14/243* (2013.01); *H01L 2251/5338* (2013.01); *H01L 2251/568* (2013.01); *Y02E 10/549* (2013.01); *Y02P 70/50* (2015.11)

(58) Field of Classification Search
CPC ............. H01L 51/56; H01L 2251/5338; Y02E 10/549; Y02P 70/521; C23C 14/0078; C23C 14/04; C23C 14/243
USPC .................................................. 427/98.4, 58
See application file for complete search history.

(56) References Cited

U.S. PATENT DOCUMENTS

| | | | |
|---|---|---|---|
| 4,769,292 A | | 9/1988 | Tang et al. |
| 4,842,973 A | * | 6/1989 | Badesha ............. C23C 14/0623 427/76 |
| 5,167,984 A | * | 12/1992 | Melnyk ................ C23C 14/243 427/248.1 |
| 5,247,190 A | | 9/1993 | Friend et al. |
| 5,529,674 A | * | 6/1996 | Hedgcoth ........... C23C 14/3407 204/192.12 |
| 5,596,673 A | * | 1/1997 | Ward ...................... B01D 7/00 118/726 |
| 5,703,436 A | | 12/1997 | Forrest et al. |
| 5,707,745 A | | 1/1998 | Forrest et al. |
| 5,834,893 A | | 11/1998 | Bulovic et al. |
| 5,844,363 A | | 12/1998 | Gu et al. |
| 6,013,982 A | | 1/2000 | Thompson et al. |
| 6,087,196 A | | 7/2000 | Sturm et al. |
| 6,091,195 A | | 7/2000 | Forrest et al. |
| 6,097,147 A | | 8/2000 | Baldo et al. |
| 6,294,398 B1 | | 9/2001 | Kim et al. |
| 6,303,238 B1 | | 10/2001 | Thompson et al. |
| 6,337,102 B1 | | 1/2002 | Forrest et al. |
| 6,468,819 B1 | | 10/2002 | Kim et al. |
| 6,566,032 B1 | | 5/2003 | Boroson et al. |
| 7,169,232 B2 | | 1/2007 | Strip et al. |
| 7,279,704 B2 | | 10/2007 | Walters et al. |
| 7,427,782 B2 | | 9/2008 | Daniels et al. |
| 7,431,968 B1 | | 10/2008 | Shtein et al. |
| 7,736,438 B2 | * | 6/2010 | Storer ................. C23C 14/0021 118/718 |
| 7,968,146 B2 | | 6/2011 | Wagner et al. |
| 8,525,163 B2 | | 9/2013 | Fujita |
| 2003/0052616 A1 | * | 3/2003 | Antoniadis ......... H01L 27/3211 315/169.3 |
| 2003/0189403 A1 | | 10/2003 | Yamada et al. |
| 2003/0230980 A1 | | 12/2003 | Forrest et al. |
| 2004/0174116 A1 | | 9/2004 | Lu et al. |
| 2005/0008778 A1 | * | 1/2005 | Utsugi ................. C23C 14/042 427/248.1 |
| 2005/0053542 A1 | * | 3/2005 | Harutyunyan ........ C01B 32/162 423/447.3 |
| 2005/0274319 A1 | | 12/2005 | Strip et al. |
| 2008/0271606 A1 | * | 11/2008 | Holmes .................... B01J 20/20 96/132 |
| 2009/0272322 A1 | | 11/2009 | Fujinami et al. |
| 2010/0140078 A1 | | 6/2010 | Pinarbasi et al. |
| 2010/0189900 A1 | | 7/2010 | Dickey et al. |
| 2011/0065282 A1 | * | 3/2011 | Yan ...................... C23C 14/042 438/758 |
| 2011/0100955 A1 | | 5/2011 | Pushparaj et al. |
| 2011/0253425 A1 | | 10/2011 | Haase et al. |
| 2012/0097939 A1 | | 4/2012 | Fujita |
| 2012/0107487 A1 | * | 5/2012 | Cannella ............... C23C 14/042 427/66 |
| 2012/0219708 A1 | | 8/2012 | Dickey et al. |
| 2013/0068374 A1 | | 3/2013 | Balaschak et al. |
| 2013/0089665 A1 | | 4/2013 | Takenaka et al. |
| 2013/0097939 A1 | * | 4/2013 | Blume ..................... E06B 3/485 49/506 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

\* cited by examiner

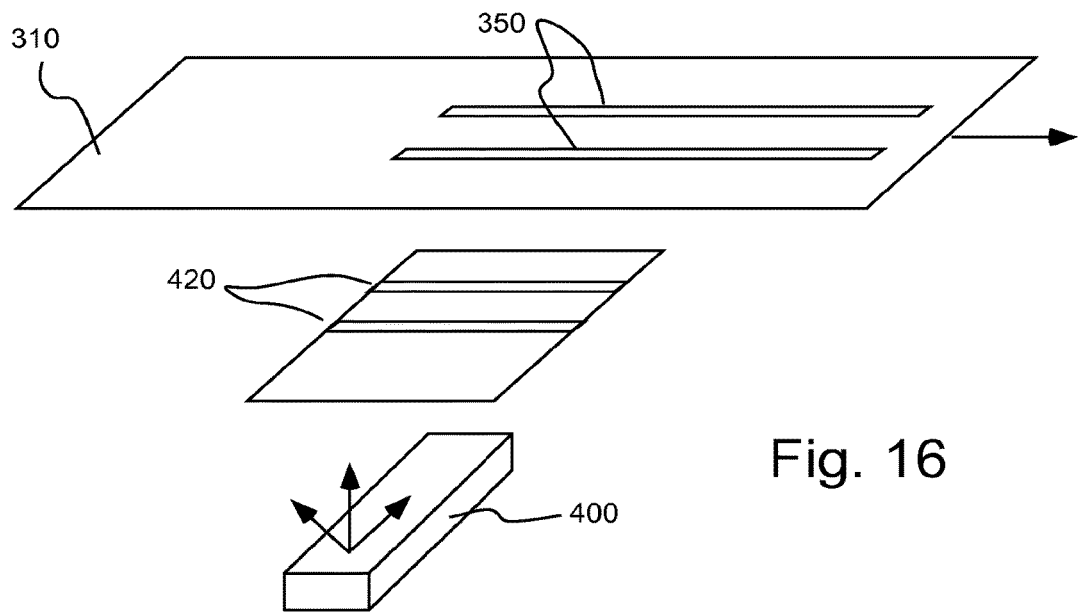
Fig. 16
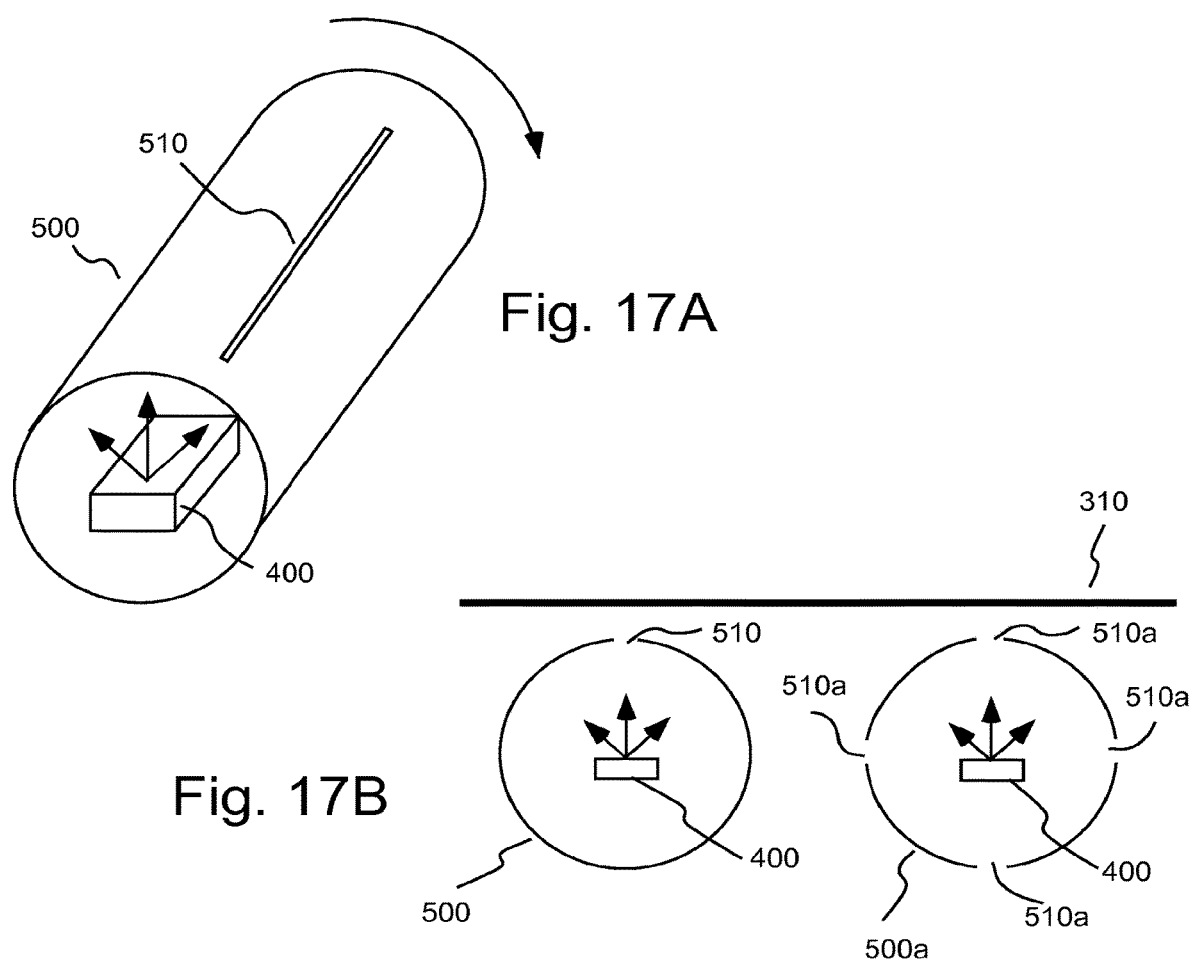
Fig. 17A
Fig. 17B

MANUFACTURING FLEXIBLE ORGANIC ELECTRONIC DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD

In a number of embodiments, devices, systems and methods hereof relate to organic electronic devices including, for example, organic light-emitting diode devices and manufacture thereof.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies or the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using International Commission on Illumination (CIE) coordinates, which are well known to the art.

One example of a green emissive molecule is tris(2-phenylpyridine) iridium, denoted Ir(ppy)$_3$, which has the following structure:

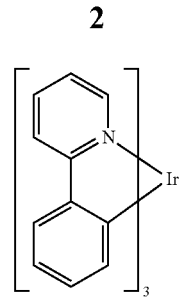

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

Most rigid OLEDs are formed on a glass substrate and encapsulated with a glass or metal plate, sealed around the edge with a bead of adhesive such as UV-curable epoxy. Some work has been published on flexible displays encapsulated with a thin film moisture barrier deposited directly on top of the OLED. In those cases, the barrier is either an inorganic thin film or a composite organic-inorganic multi-layer stack. Organic-inorganic stacks are particularly good at covering particulate defects on the OLED surface (however, at the expense of a longer TAC time and more complex material structure).

OLEDs may find use in a range of applications including, for example, displays, signage decorative lighting, large area flexible illumination, automotive applications and general lighting. In general, it is believed that significant price savings can be achieved in OLED manufacturing using roll-to-roll processing. In that regard, throughput is relatively high in such processes. Moreover, relatively inexpensive metal foils and plastic webs may be used as substrates.

A roll-to-roll fabrication process methodology and system 10 is set forth in FIG. 1. In FIG. 1, a substrate 20 is unwound from a substrate feed roller 22, fed to a roll coating roller 24, and undergoes plasma pretreatment with a linear ion source 14. Fourteen vacuum organic evaporator stations 40a-40n are positioned around roll coating roller 24 as illustrated in FIG. 1. A DC-magnetron 50 for sputtering and two metal evaporators to deposit a cathode follow organic evaporator stations 40a-40n to form OLEDs on a device side or surface 30 of substrate 20. After OLED deposition thereon as described above, substrate 20 is wound upon a retrieval roller 82. During rolling or winding upon retrieval roller 82, substrate surface 30 is enveloped by a protective liner film or interleaf liner 70 provided from roll 72 in an attempt to reduce surface damage of the sensitive organic layers.

A mobile roll transfer box (not shown) allows roll transfer of the retrieval roller 82 between system 10 and a lamination unit (not shown) under inert conditions in an attempt to limit overall $H_2O$ and $O_2$ exposure during the transfer. A roll-to-roll encapsulation unit is operated under inert atmosphere, and a roll-to-roll optical inspection system provides for defect characterization.

BRIEF SUMMARY

In one aspect, a method of forming microelectronic systems on a flexible substrate includes depositing a plurality of layers on one side of the flexible substrate. Each of the plurality of layers is deposited from one of a plurality of sources. A vertical projection of a perimeter of each one of the plurality of sources does not intersect the flexible substrate. The flexible substrate is in motion during the depositing the plurality of layers via a roll to roll feed and retrieval system. In a number of embodiments, a vertical projection of a perimeter of at least one of an inspection system or a treatment system does not intersect the flexible substrate. The flexible substrate may, for example, be supported upon a generally cylindrical support roller during the depositing of the plurality of layers. The method may, for example, further comprising cooling.

In a number of embodiments, at least one of the plurality of layers is selected from the group consisting of an insulating layer, an organic layer, a conductive layer, and an encapsulation layer. At least one of the plurality of layers may, for example, be deposited from one of the plurality sources at an angle that is neither horizontal nor vertical. In a number of embodiments, multiple organic thin film layers are deposited and at least one of two electrodes of the microelectronic systems is deposited. The flexible substrate may, for example, include a pre-patterned electrode. The multiple organic thin film layers are deposited between the two electrodes. A thin film encapsulation layer may, for example, be deposited on top of the multiple organic thin film layers and the two electrodes. In a number of embodiments, the multiple organic thin film layers, the two electrodes and the thin film encapsulation layer are deposited under vacuum. The multiple organic thin film layers, the at least one of two electrodes and the thin film encapsulation layer are deposited without breaking vacuum.

The method may, for example, also include applying a surface treatment before depositing any of the multiple organic thin film layers. In a number of embodiments, the at least one of the two electrodes is deposited before any of the multiple organic thin film layers. In a number of embodiments, at least one barrier layer is deposited before any of the multiple organic thin film layers.

The microelectronic system may, for example, be wound upon a retrieval roller after deposition of the at least one thin film encapsulation layer. The surface of the microelectronic system may, for example, be laminated before being wound upon the retrieval roller. In a number of embodiments, the flexible substrate is unwound from a feed roller before depositing a first of the plurality of layers. In a number of embodiments, the flexible substrate is unwound from the feed roller and the microelectronic system is wound upon the retrieval roller in a single unwind and wind cycle.

In a number of embodiments, the microelectronic systems are organic light emitting diodes. In a number of embodiments, the method further includes unwinding the flexible substrate from a feed roller and winding the organic light emitting diodes formed on the flexible substrate on a retrieval roller. As described above, multiple organic thin film layers may be deposited and at least one of two electrodes may be deposited, wherein the multiple organic thin film layers are deposited between the two electrodes. A thin film encapsulation layer may be deposited on top of the multiple organic thin film layers and the two electrodes.

In another aspect, a manufacturing system for forming one or more microelectronic systems on a flexible substrate includes a plurality of deposition sources to deposit a plurality of layers on one side of the flexible substrate, wherein all of the plurality of layers are deposited under vacuum, and wherein a vertical projection of a perimeter of each of the plurality of sources does not intersect the flexible substrate. The flexible substrate may be in motion during the depositing of the plurality of layers via a roll to roll feed and retrieval system. In a number of embodiments, vacuum is not broken during depositing of the plurality of layers. At least one of the plurality of layers may, for example, be selected from the group consisting of an insulating layer, an organic layer, a conductive layer, and an encapsulation layer. At least one of the plurality of layers may, for example, be deposited from one of the plurality sources at an angle that is neither horizontal nor vertical.

In another aspect, a microelectronic system is formed by the process of depositing a plurality of layers on one side of a flexible substrate, each of the plurality of layers being deposited from one of a plurality of sources, wherein a vertical projection of a perimeter of each one of the plurality of sources does not intersect the flexible substrate, and wherein the flexible substrate is in motion during the depositing of the plurality of layers via a roll to roll feed and retrieval system. The microelectronic system may, for example, be an organic light emitting diode system.

In another aspect, a method of depositing a material at less than atmospheric pressure onto a moving substrate web includes delivering the material into an interior of at least one cylinder. The cylinder includes at least one opening therein through which the material may pass to exit the interior of the cylinder. The method further includes rotating the cylinder so that the material passes through the at least one opening to be deposited upon the moving web in a determined pattern. The pressure may, for example, be between 10 to $10^{-8}$ torr or between $10^{-4}$ to $10^{-7}$ torr. The source of the material may, for example, be positioned within the cylinder. In a number of embodiments, an axis of the cylinder is generally perpendicular to a direction of motion of the web.

The speed of the web may, for example, be programmable. The rotational speed of the cylinder may, for example, programmable.

In a number of embodiments, the cylinder includes a plurality of openings through which the material may pass to be deposited upon the web. In a number of embodiments, the determined pattern includes a two-dimensional matrix.

In a number of embodiments, microelectronic systems are formed on the web. The material may, for example, be an organic material or a conductive material. The material may, for example, be an evaporative material. In a number of embodiments, the determined pattern includes bus lines over a transparent conductor on the web.

In a further aspect, a system for depositing a material onto a moving substrate web includes a system for moving the web, a cylinder comprising at least one opening therein through which the material within an interior of the cylinder may pass to exit the interior of the cylinder at less than atmospheric pressure, and a control system to rotate the cylinder in a controlled manner so that the material passes through the at least one opening to be deposited upon the moving web in a determined pattern.

In still a further aspect, a substrate web having a determined pattern is formed by the process of delivering the material into an interior of at least one cylinder, wherein the cylinder includes at least one opening therein through which the material may pass to exit the interior of the cylinder, and rotating the cylinder so that the material passes through the at least one opening to be deposited upon the web in the determined pattern as the web is moving. The material is deposited upon the web at a pressure less than atmospheric pressure.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

BRIEF DESCRIPTION OF THE SEVERAL VIEWS OF THE DRAWINGS

FIG. 16 illustrates schematically a process for depositing lines such as metal bus lines in the direction of a moving substrate.

FIG. 17A illustrates an embodiment of a cylindrical mask hereof.

FIG. 17B illustrates two cylindrical masks hereof in position to deposit material on a moving substrate wherein a first cylinder includes a single opening or slit and a second cylinder includes a plurality of openings or slits.

DETAILED DESCRIPTION

The methods, devices and systems hereof can be used in connection with organic electronic devices generally. A number of representative embodiments thereof are discussed in connection with representative embodiments of flexible OLEDs formed in continuous, roll-to-roll processes.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Early OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
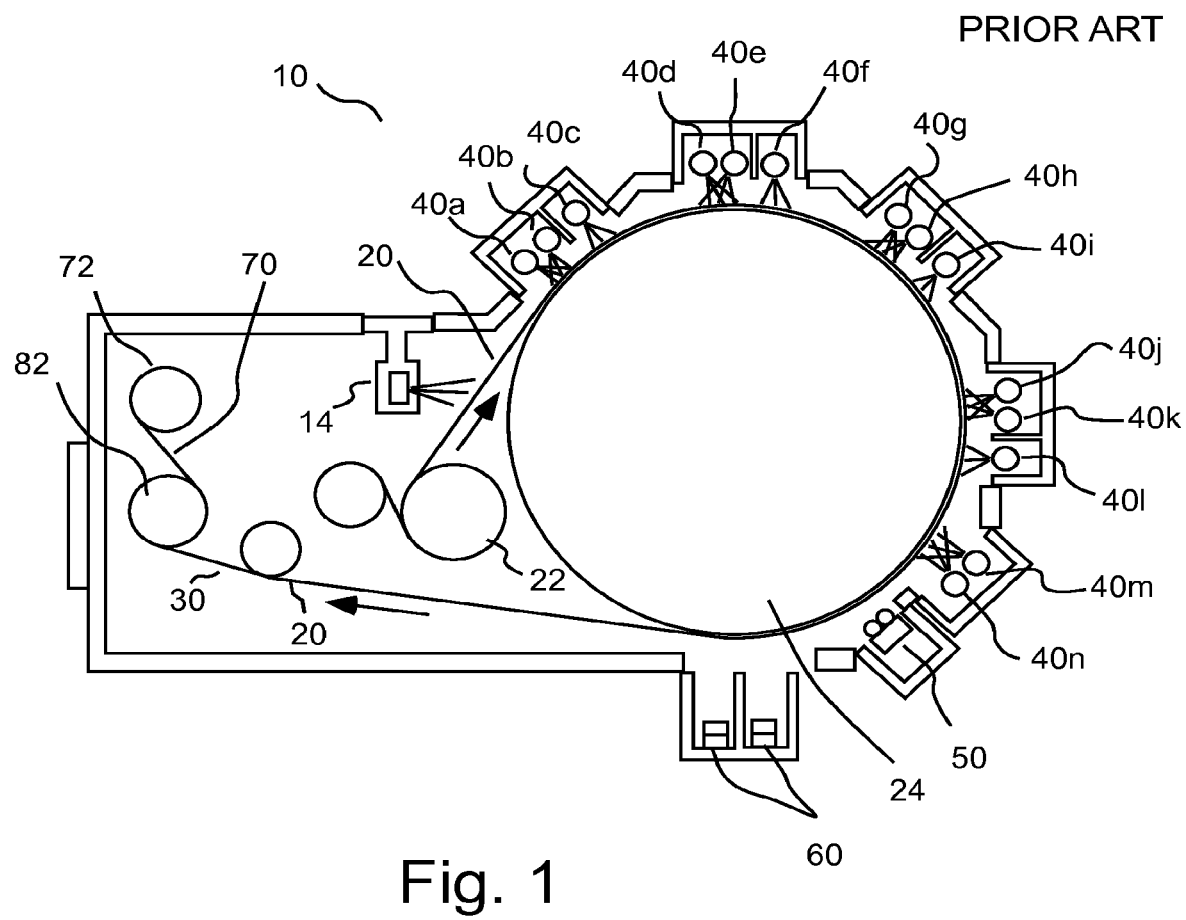
FIG. 1 illustrates schematically an embodiment of a roll-to-roll vacuum coating process which includes a winding unit, plasma pre-treatment with a linear ion source, organic linear evaporators, a magnetron and metal evaporators.

FIG. 1 illustrates an embodiment of an organic light emitting device 100. The figures are drawn schematically and are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
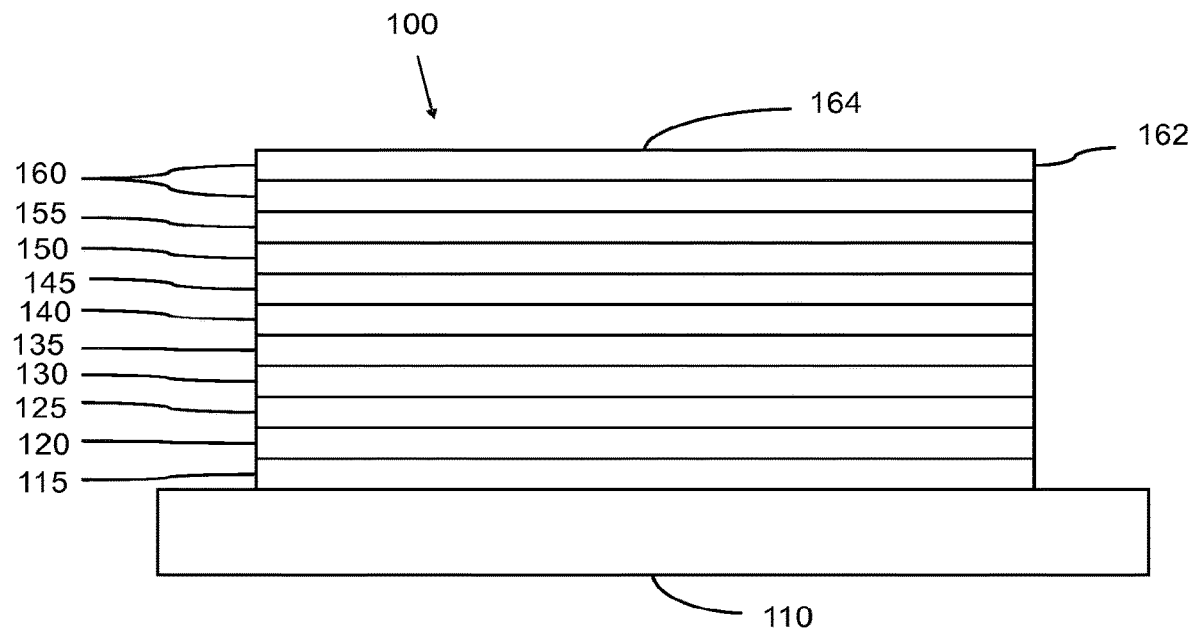
FIG. 2 illustrates schematically an embodiment of organic light emitting device.
Figure 3:
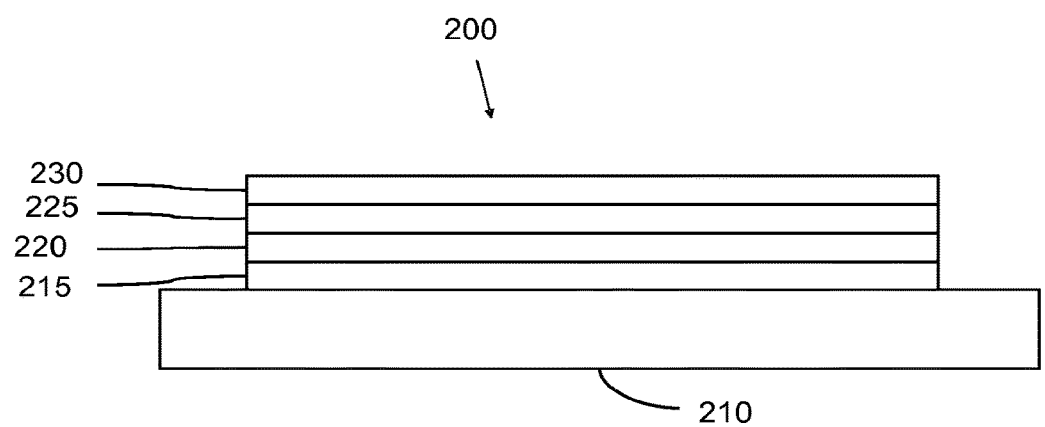
FIG. 3 illustrates schematically an embodiment of an inverted organic light emitting device that does not have a separate electron transport layer.

FIG. 2 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides an example of how some layers may be omitted from the structure of device 100.

The simple layered structure illustrated in FIGS. 1 and 2 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

OLED Devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. A barrier layer may, for example, comprise a mixture of a polymeric material and a non-polymeric material as described in U.S. Pat. No. 7,968,146, PCT Pat. Application Nos. PCT/US2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may, for example, be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.).

As described above, the materials and structures described herein may have applications in devices (for example, organic electronic devices) other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a layer" includes a plurality of such layers and equivalents thereof known to those skilled in the art, and so forth, and reference to "the layer" is a reference to one or more such layers and equivalents thereof known to those skilled in the art, and so forth.

As described above, it is believed that significant price savings can be achieved in OLED manufacturing using roll-to-roll processing via, for example, high throughput and the use of relatively inexpensive metal foils and polymer webs as substrates. Nonetheless, there are a number of problems with current roll-to-roll processes as, for example, illustrated in FIG. 1. For example, the encapsulation of the OLEDs in that process is done by laminating a barrier film on top of device. However, between the lamination film and the OLED, a thin layer of glue is required at least in the perimeters. The thin glue layer may provide a short circuit for moisture and oxygen. To mitigate this problem, a glue with less moisture permeation property can be used along the edges of the two films. However, this may only slow down the moisture/oxygen permeation to certain degree. Also, the lamination glue itself contains moisture or other gases which may damage the device underneath.

Furthermore, contact of a solid material, surface or object with the various organic layers, electrodes, etc. after deposition thereof on device side 30 of substrate 20 prior to encapsulation thereof can damage delicate OLEDs and other organic electronic devices. For example, winding flexible substrate 20 into a retrieval roller 22 can cause significant damage to OLEDs and other organic electronic devices. In that regard, layers are brought into mechanical contact with neighboring layers as a result of winding, which can easily cause damage to the delicate OLED and other organic electronic devices. Further, one particle can cause protrusions in every other layer. Also, relative movement between neighboring layers can also easily cause damage to the OLEDs. Using an interleaf as described in connection with FIG. 1 may reduce some of the damage associated with winding, but not eliminate it. Moreover, contact with the surface of interleaf layer 70 of FIG. 1 introduces another potential source of damage. Interleaf layer 70 may also bring in large particles, causing additional damage. Damage may, for example, also be caused via contact with a tensioning roller or other positioning, tensioning or other devices which contacts device side 30 of substrate 20 in certain processes.

Another problem with certain processes such as illustrated in FIG. 1 is that the depositions system in some of the deposition stations are positioned above the substrate, significantly increasing the chance for particles to fall onto the deposition surface. As known in the art, particles can cause defects such as shorts or bright spots in OLED devices. For web process of OLEDs, particles are particularly damaging for two additional reasons. In that regard, thin film encapsulation, which is required for flexible OLEDs, is very sensitive to particles. A single defect in encapsulation caused by such particles can result the failure of the entire device. Moreover, particles may cause protrusions on all the layers that on top or beneath the particles as described above (resulting in a much bigger impact than just the device upon which the particles are located).

Figure 4:
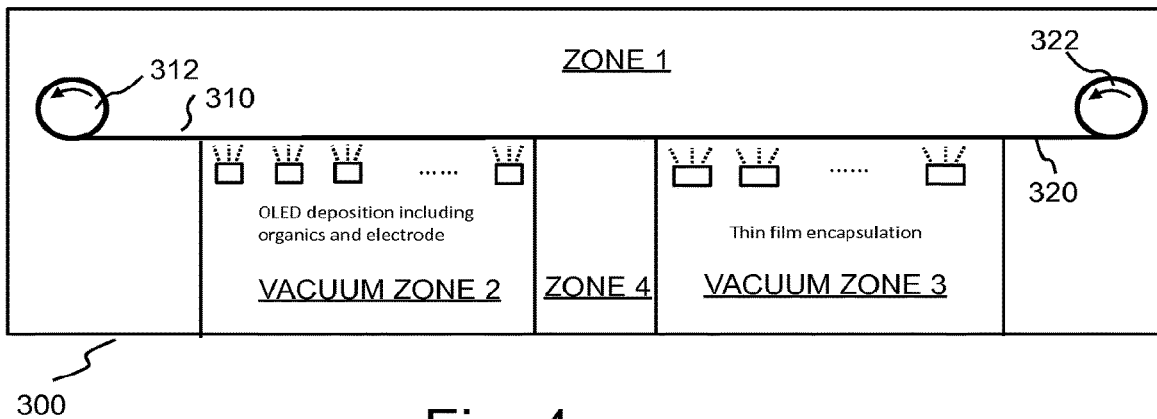
FIG. 4 illustrates schematically an embodiment of a process and system hereof to deposit organic electronic devices (for example, OLEDs) and encapsulation thin films sequentially under vacuum.

In a number of embodiments of method, devices and systems hereof microelectronic systems are formed on a flexible substrate by depositing on the flexible substrate at least one organic thin film layer, at least one electrode and at least one thin film encapsulation layer over the at least one organic thin film layer and the at least one electrode. In a number of embodiments, depositing the organic thin film layer, depositing the at least one electrode and depositing the at least one thin film encapsulation layer each occur under vacuum and without winding around a roller during or between the depositions thereof. In a number of embodiments, there is no contact of the device side of the flexible substrates (that is, the side or surface upon which deposition occurs) with any solid surface prior to deposition of the thin film encapsulation layer. FIG. 4 illustrates a simple representative example of a system 300 and method hereof. System 300 includes a flexible substrate delivery system including a feed or source roller 312 from which flexible substrate 310 is unwound and a retrieval roller 322 upon which flexible substrate 310 (including, for example, OLED devices on device side or surface 320 thereof) is wound after encapsulation. In the embodiment of FIG. 4, there are two basic deposition zones, both under vacuum. In vacuum zone 2, the various layers of the OLED devices or other organic electronic devices, including electrodes and organic layers are deposited. In vacuum zone 3, thin film encapsulation is deposited. In the case that substrate 310 already includes a first electrode (for example, an indium tin oxide or ITO electrode) deposited, vacuum zone 2 may, for example, be a vacuum thermal evaporation (VTE) zone where multiple deposition sources can be sequentially arranged to deposit materials including, for example, a hole injection layer (HIL), a hole transport layer (HTL), an emissive layer (EML), an electron transport layer ETL, an electron injection layer (EIL) and thin metal such as Al or Ag as a second electrode to form organic electronic devices. After the OLED or other organic electronic device materials are deposited, a thin film is deposited in vacuum zone 3 to encapsulate the device under vacuum condition.

Inside each of vacuum zones 2 and 3, there are different deposition sources (or stations), as shown in FIG. 4. Because the nature of roll-to-roll process, linear sources are desirable. The setup for each deposition source is determined, for example, by the substrate (for example, a polymeric web) moving speed, deposition rate and thickness required for each material. If a certain material requires a thickness that cannot be achieved by a single source, multiple sources can be used for the same material. In a number of embodiments, the flexible substrate can travel only in the direction from the feed roller to the retrieval roller. In other embodiments, the substrate can travel in the direction from the feed roller to the retrieval roller and in the direction from the retrieval roller to the feed roller.

Figure 5:
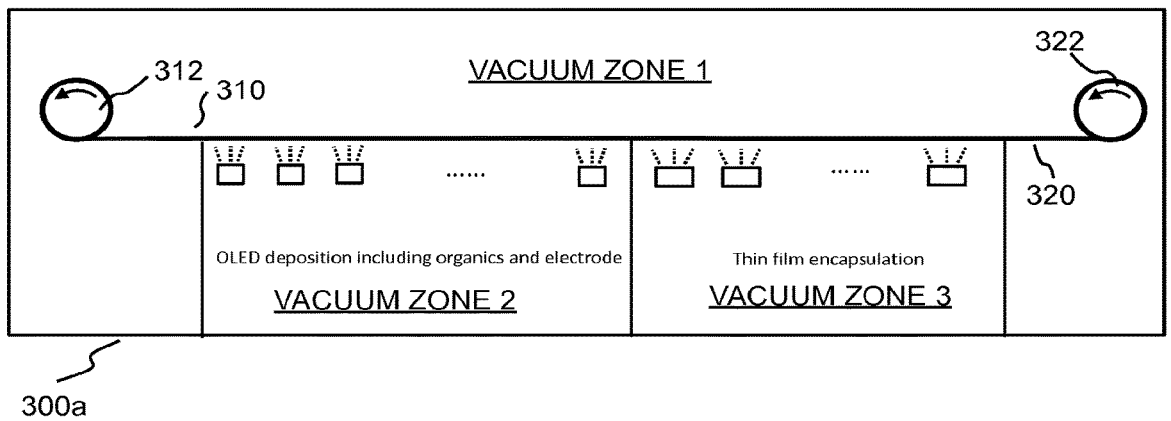
FIG. 5 illustrates schematically another embodiment of a process and system hereof to deposit organic electronic devices (for example, OLEDs) and encapsulation thin films sequentially under vacuum.

In a number of embodiments, zone 1 is a vacuum zone. Zone 4 may optionally be a vacuum zone, but better results may be obtained if zone 4 is a vacuum zone. Nonetheless, vacuum is not required in zone 4 as long as zone 4 is controlled environment which protects the OLEDs from moisture and oxygen. FIG. 5 illustrates a method and system 300a hereof (including the components of system 300) wherein vacuum is not broken between OLED deposition in vacuum zone 2 and thin film encapsulation in vacuum zone 3. In FIG. 5, the OLED devices are always under vacuum before they are fully encapsulated, which minimizes the exposure to moisture and oxygen.

A system such as illustrated in FIG. 1 requires the moving of deposited OLED devices in an inert environment to an encapsulation station. The water and oxygen level in a well maintained glove box is, for example, about 1 ppm. A glove box with $N_2$ environment maintained at 1 ppm humidity level contains 1 mol $H_2O$ per $10^6$ mol $N_2$. (1 mol is $6.023 \times 10^{23}$ molecules). By using the gas equation pV=nRT, where p is the pressure, V is volume, n is mols of gas, R is the gas constant, and T is the temperature, we can calculate the number of mols of $N_2$ in a glove box at 1 atm pressure at room temperature (wherein R is $8.2 \times 10^{-5}$ m$^3$ atm/K/mol). Using the gas equation, we get the number of mols of $N_2$ per unit volume in the glove box to be 41 mol/m$^3$. This means the number of mols of $H_2O$ will be $4.1 \times 10^{-5}$ mol/m$^3$ in the glove box with 1 ppm moisture concentration. On the other hand in a vacuum chamber maintained at $10^{-7}$ Torr, the number of mols of gas present per unit volume is $5.4 \times 10^{-9}$ mol/m$^3$. The material may, for example, be deposited at a pressure between approximately 10 to $10^{-10}$ torr. In a number of embodiments, the material is deposited at a pressure between approximately between $10^{-3}$ to $10^{-7}$ torr. Usually, moisture content at such pressure is about 70-80%, but for simplicity, we will assume that all the gas present is water vapor. Therefore, the number of mols of $H_2O$ present per unit volume is also $5.4 \times 10^{-9}$ mol/m$^3$. This value is four orders of magnitude less than that present in a glove box with 1 ppm moisture concentration. Calculations to estimate the time for a monolayer of water to be deposited at high vacuum conditions show that, at $10^{-7}$ Torr, it takes about 10 sec for a monolayer of water to form on the surface. Given the high concentration of water in the glove box it will take much less time for a monolayer to form in the glove box environment than in a high vacuum environment. Therefore, to transfer a finished, but un-encapsulated, device in a glove box type (inert) environment may not be suitable even if it is maintained at 1 ppm moisture level.

Because substrate 310 is wound after the OLEDs are made and encapsulated, many adverse issues with the system described in connection with FIG. 1 are resolved. In that regard, the thin film encapsulation provides total coverage of the OLED devices, leaving no path for moisture to attack. As set forth above, encapsulation may serve as a barrier layer or coating to limit permeation of, among other things, water vapor and oxygen. The degree of impermeability required may differ in different applications. For example, an encapsulation or barrier layer having a water vapor transmission rate of less than $10^{-6}$ g/m$^2$/day and/or an oxygen transmission rate of less than $10^{-2}$ g/m$^2$/day or less than $10^{-3}$ g/m$^2$/day may be suitable for protecting OLEDs. Moreover, the encapsulation film provide mechanical protection for the underlying OLED devices. Further, the thin film encapsulated OLED devices are no longer sensitive to following steps or processes in terms of moisture/oxygen exposure.

Figure 6:
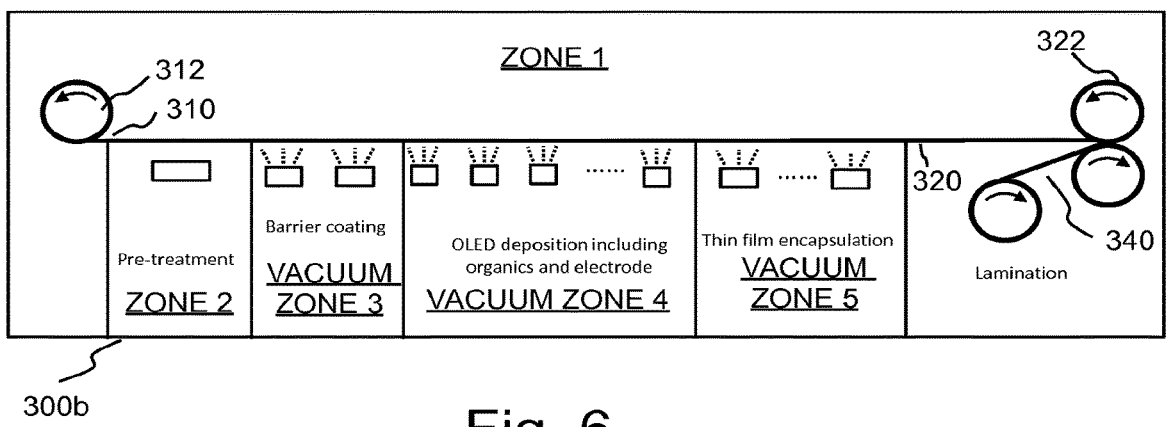
FIG. 6 illustrates schematically another embodiment of a process and system hereof to deposit organic electronic devices (for example, OLEDs) and encapsulation thin films under vacuum, and further including pretreatment and barrier coating stations/processes.

FIG. 6 illustrates a more complicated system 300b, which includes the components of system 300 and additional functionality. In system 300b, substrate 310 first goes through a pre-treatment process wherein substrate 310 may, for example, be cleaned and baked to drive out moisture in zone 2. Other processes such as UV or plasma treatment may also be used. When substrate 310 is formed from one or more polymeric materials, a barrier coating may, for example, be applied in vacuum zone 3 to protect the OLEDs from moisture/$O_2$ attack from the substrate side. In vacuum zone 4 of system 300b, the OLED organic layers and one or both electrodes of the OLED devices may be deposited. In the case that substrate 310 does not include a pre-patterned first electrode/anode, for a conventional bottom emission device, a transparent electrode/anode such as ITO may be deposited first. In this case, a sputtering tool for electrode deposition will required its own vacuum environment. After ITO deposition, various organic layers can be deposited sequentially, followed by a thin metal cathode. In zone 5, a thin film is deposited to encapsulate the OLED devices (via a thin film deposition technique as, for example, described in U.S. Pat. No. 7,968,146). Before substrate 310 with encapsulated device (on device side 320) is wound upon retrieval roller 322, a film 340 may be laminated over device side 320 to further protect the OLED devices and provide protection from mechanical damage incurred during the winding process. Lamination film 340 may have other functionality including, for example, polarizers, AR films, light extraction films such as diffusor or micro-lens array films, barrier coated films, and so on. In the illustrated embodiment, all deposition zones 3, 4 and 5 are under vacuum while other zones may optionally, and even desirably, be under vacuum.

Figure 7:
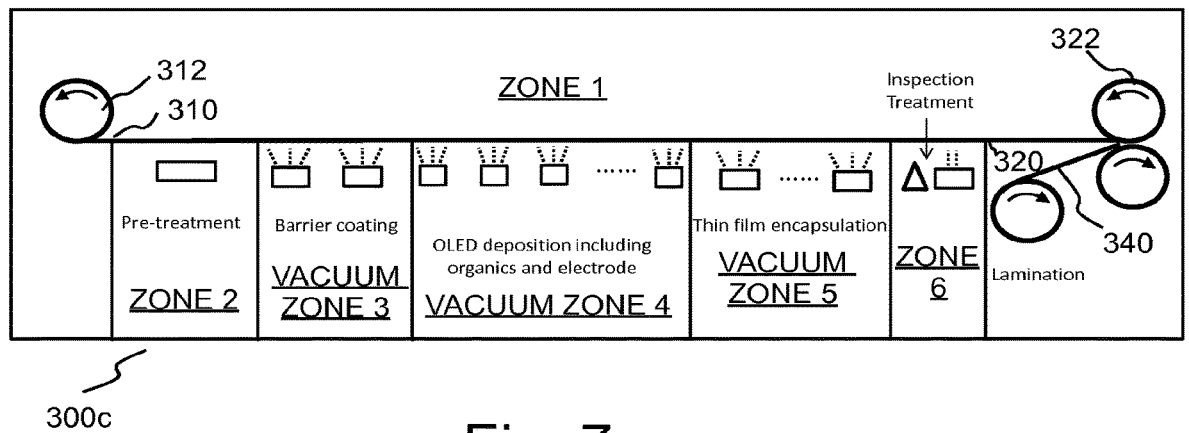
FIG. 7 illustrates schematically another embodiment of a process and system hereof to deposit organic electronic devices (for example, OLEDs) and encapsulation thin films under vacuum, and further including inspection and treatment stations/processes.

FIG. 7 illustrates another configuration of a system 300c including the components of system 300 and additional functionality. In that regard, system 300c includes an inspection station or system and a treatment station or system in zone 6 thereof. One or more inspection stations may, for example, be added to different steps or processes in the OLED process. In this example, an inspection station is added after thin film encapsulation and before winding on retrieval roller 322. In addition, a treatment step may be incorporated after the inspection. For example, once a defect such as a particle is detected, certain treatments may be applied to treat the defect. Such treatments include, for example, 1) marking the defect; 2) removing the defect (e.g., by laser); 3) removing the area (cut a hole); and/or other methods. In a number of embodiments, all the deposition zones (3, 4, 5) are under vacuum, while other zones may also desirably be under vacuum.

Figure 8:
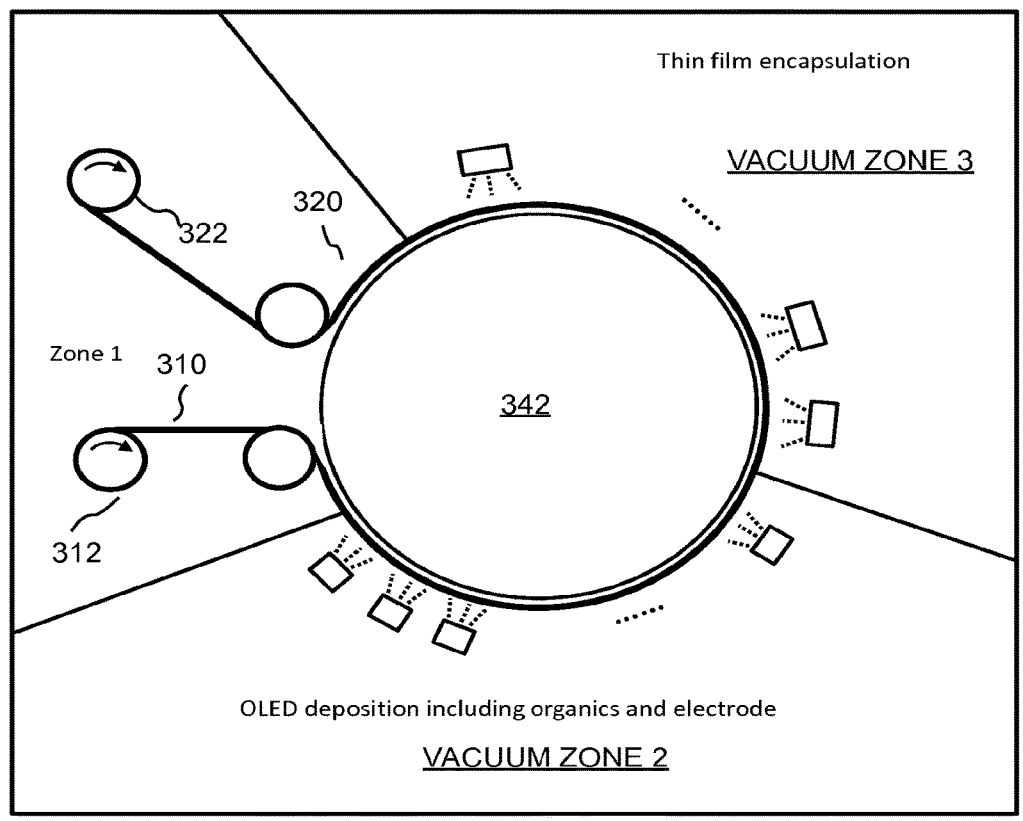
FIG. 8 illustrates the process of FIG. 5, performed around a generally circular roll coating roller.
Figure 9:
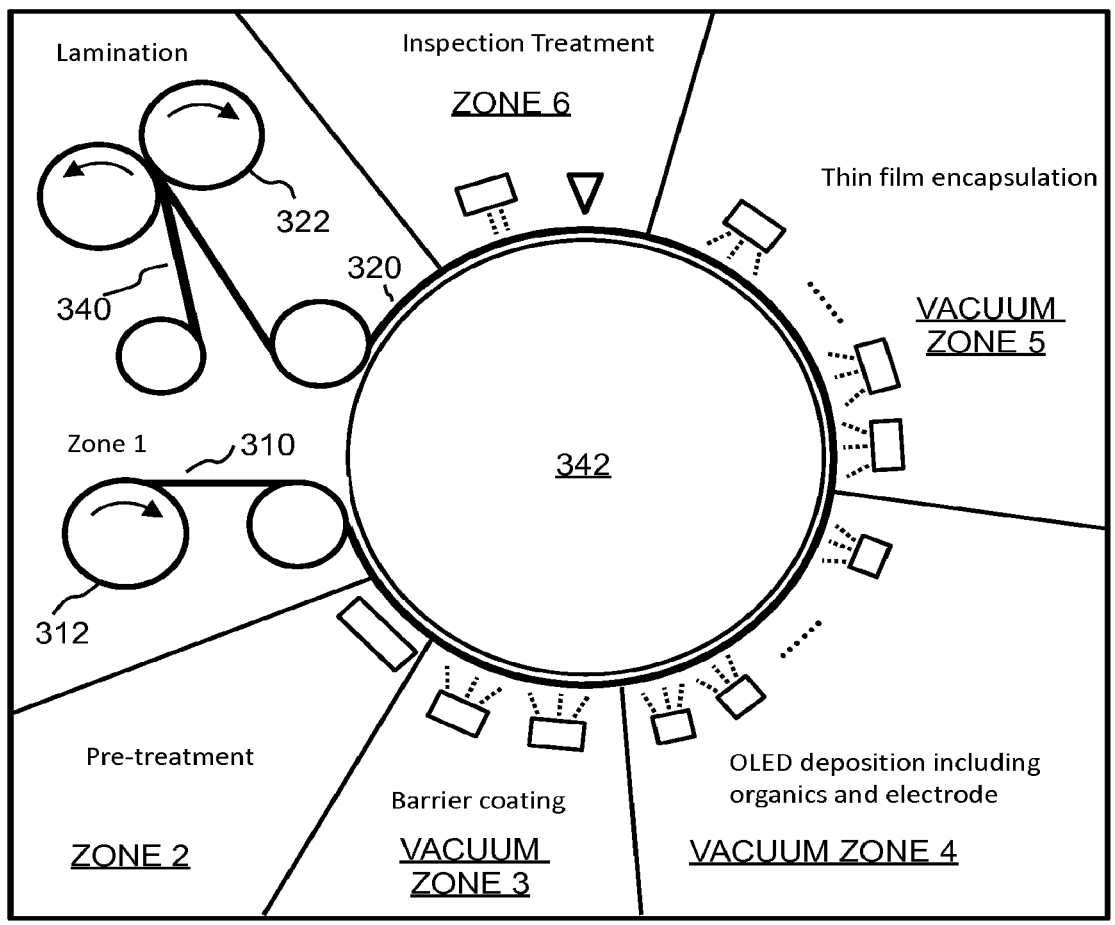
FIG. 9 illustrates the process of FIG. 7, performed around a generally circular roll coating roller.

FIGS. 4 through 7 illustrate processes and systems wherein substrate 310 is moved generally horizontally and generally linearly. However, substrate 310 may be moved and supported in an arced or circular fashion as illustrated in FIGS. 8 and 9. FIG. 8 illustrates the process of FIG. 5, performed around a generally circular roll coating roller 342. FIG. 9 illustrates the process of FIG. 7, performed around a generally circular roll coating roller 342.

The systems hereof provide generally pristine interfaces for all the layers of the OLED or other organic electronic devices. In embodiments wherein, for example, OLED deposition and encapsulation (and/or other depositions) occur without breaking vacuum, there is minimum contamination at the interfaces, which provides for best possible device performance in terms of device efficiency and lifetime. Because the thin film encapsulation directly encloses the OLEDs, both the top surface and the edge of the devices are protected. Because all processes may be performed continuously and without breaking vacuum, the handling of substrate/device is minimized. The entire/completed device is rolled or wound only after encapsulation process, increasing the safety in handling. In comparison, the method illustrated in FIG. 1 requires rolling the device before moving to encapsulation process which can cause damage (including, for example, scratches and protrusions in multiple layers due to particles).

Tension on the substrate in a roll-to-roll process provides excellent thermal contact between the substrate and a supporting fixture or fixtures, including electrodes and holders. This improvement in thermal contact is independent of the deposition direction (for example, up or down). In a number of embodiments, sufficient tension in the flexible substrate is maintained to maintain direct contact between the flexible substrate and a support therefor to facilitate thermal transfer (for example, cooling) via thermal conduction between the support and the substrate in at least one of the plurality of zones. No mechanical actuation is required with a continuous roll-to-roll process, and the registration and alignment can be significantly simplified. Moreover, no lithography is required, significantly reducing the process time (including baking) and improve device performance (for example, by eliminating wet solution/water residue). As described above, high throughput, which is controlled by web moving speed, is readily provided in a roll-to-roll process.

Figure 10:
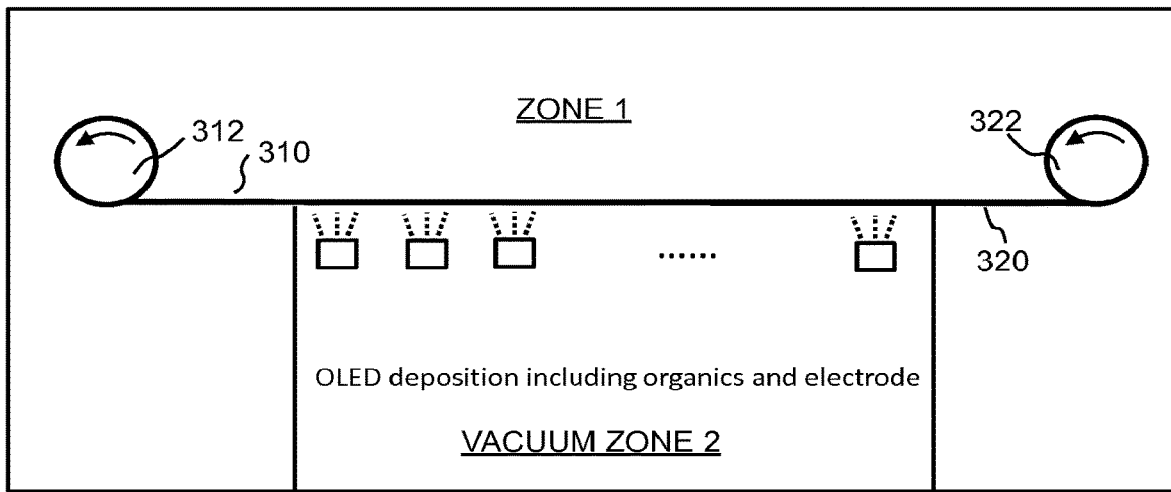
FIG. 10 illustrates schematically another embodiment of a process and system hereof to deposit organic electronic devices (for example, OLEDs) wherein a vertical projection of a perimeter of each of the deposition sources used in forming organic electronic devices does not intersect the flexible substrate.

In a number of embodiments hereof, a vertical projection (in the direction of gravity) of a perimeter of each one of the plurality of deposition sources used in forming organic electronic devices does not intersect the flexible substrate (wherein the flexible substrate is in motion during the depositing the plurality of layers via a roll-to-roll feed and retrieval system as described above). As used herein, the term "vertical" is defined as the direction aligned with the direction of the force of gravity (for example, as evidenced by a plumb line). A plane is "horizontal" at a given point if it is perpendicular to the gradient of the gravity field at that point. In other words, if gravity makes a plumb bob hang perpendicular to the plane at that point, the plane is horizontal. FIG. 10 illustrates a representative embodiment of novel process/system which reduces or minimizes particle contamination for producing OLEDs using a roll-to-roll process. The position of the deposition sources relative to the substrate set forth above greatly reduces the likelihood of particles being transported from the deposition sources to the substrate or any layer deposited or otherwise formed thereon.

FIG. 10 illustrates a very simple system in which all deposition sources are placed below device surface 320 of substrate 310. In the illustrated system, deposition is performed under a vacuum condition in zone 2. As described above, zone 1 should be at least under controlled environment to prevent the device to be contaminated by moisture and oxygen. Once again, it is desirable if zone 1 is also under vacuum. In the case of a generally linear orientation of the substrate in a roll-to-roll process, deposition or device side 320 of substrate 310 may face down (in, for example, a generally horizontal orientation of substrate 310) to minimize particle contamination (for example, as a result of gravity). The system of each of FIGS. 4 through 7 are also examples of such an orientation.

Figure 11:
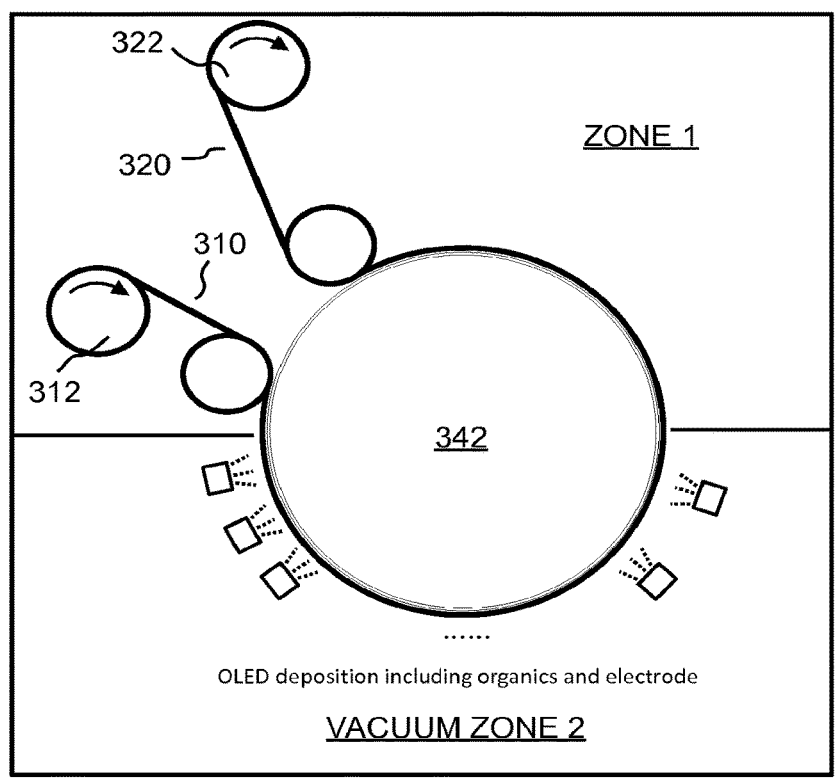
FIG. 11 illustrates the process of FIG. 10, performed around a generally circular roll coating roller wherein a vertical projection of a perimeter of each of the deposition sources used in forming organic electronic devices does not intersect the flexible substrate.
Figure 12:
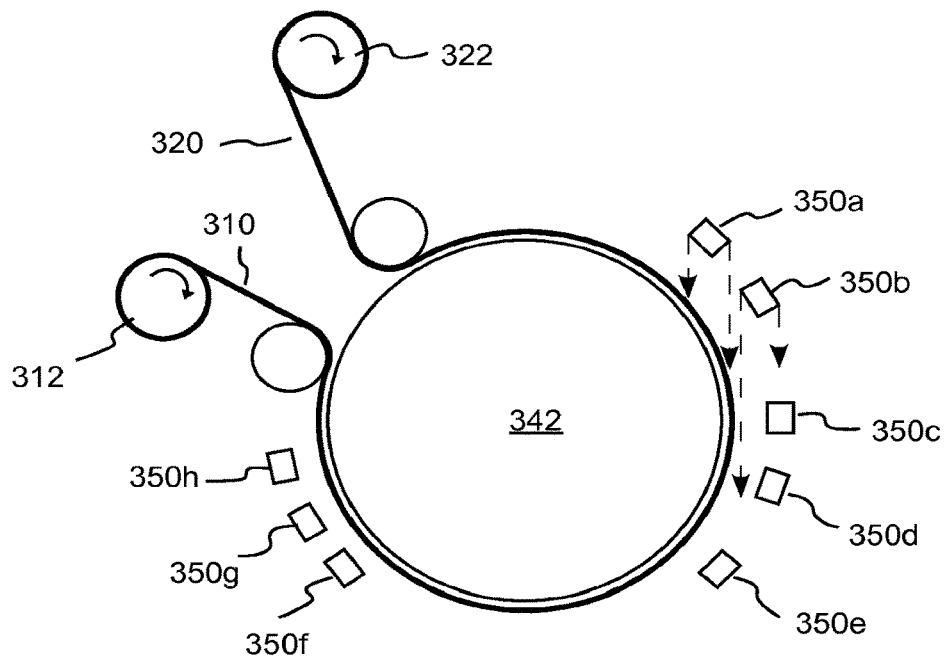
FIG. 12 illustrates schematically a process performed around a generally circular roll coating roller wherein a vertical projection of a perimeter of one of the deposition sources used in forming organic electronic devices intersects the flexible substrate.
Figure 13:
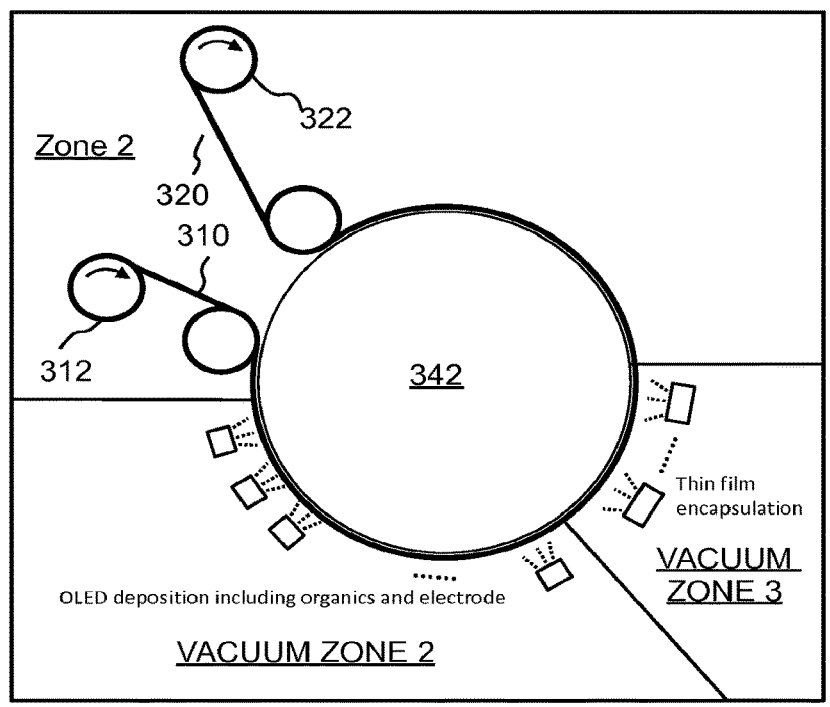
FIG. 13 illustrates the process of FIG. 5, performed around a generally circular roll coating roller, wherein a vertical projection of a perimeter of each of the deposition sources used in forming organic electronic devices does not intersect the flexible substrate.
Figure 14A:
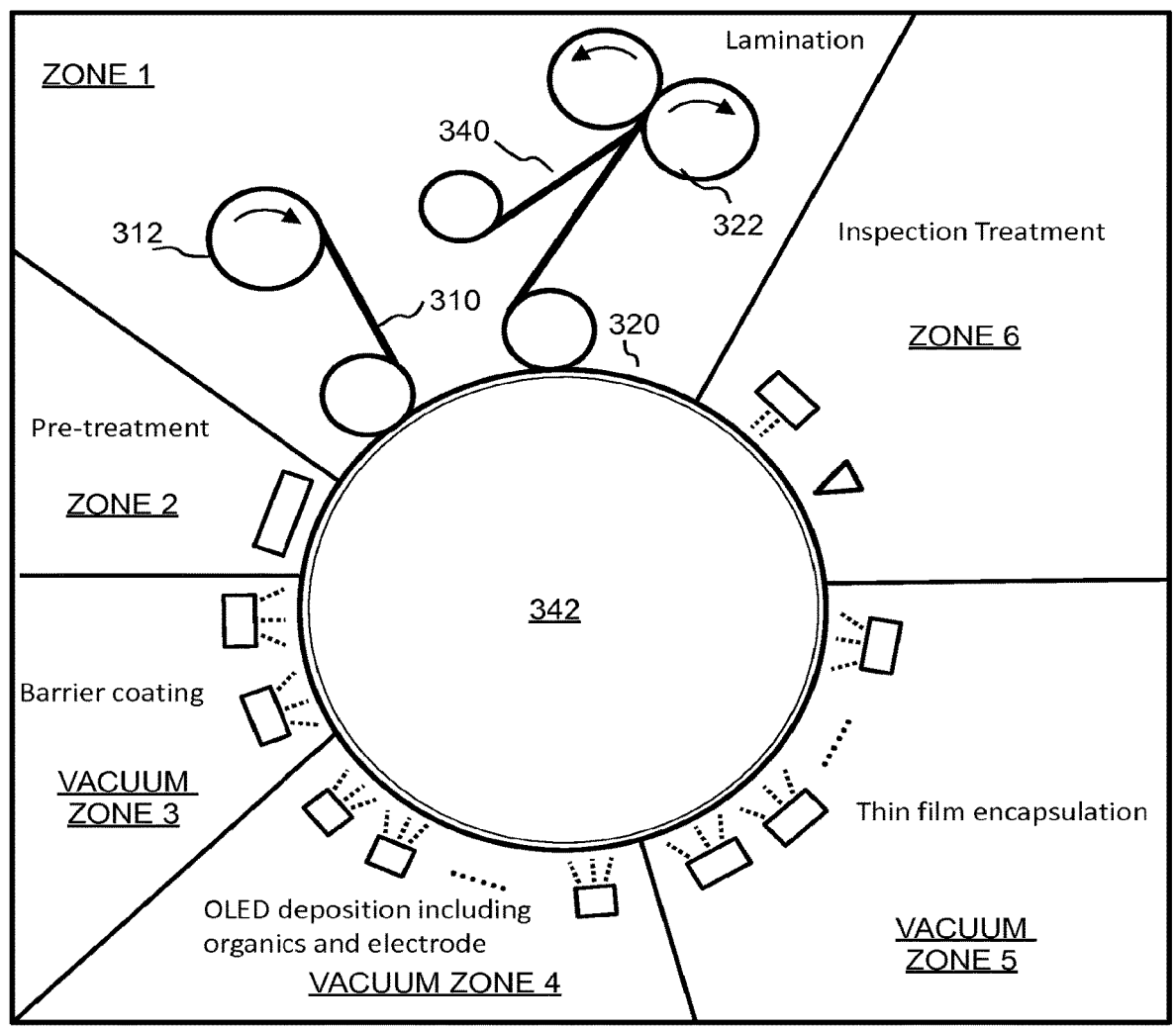
FIG. 14A illustrates the process of FIG. 7, performed around a generally circular roll coating roller, wherein a vertical projection of a perimeter of each of the deposition sources used in forming organic electronic devices does not intersect the flexible substrate.
Figure 14B:
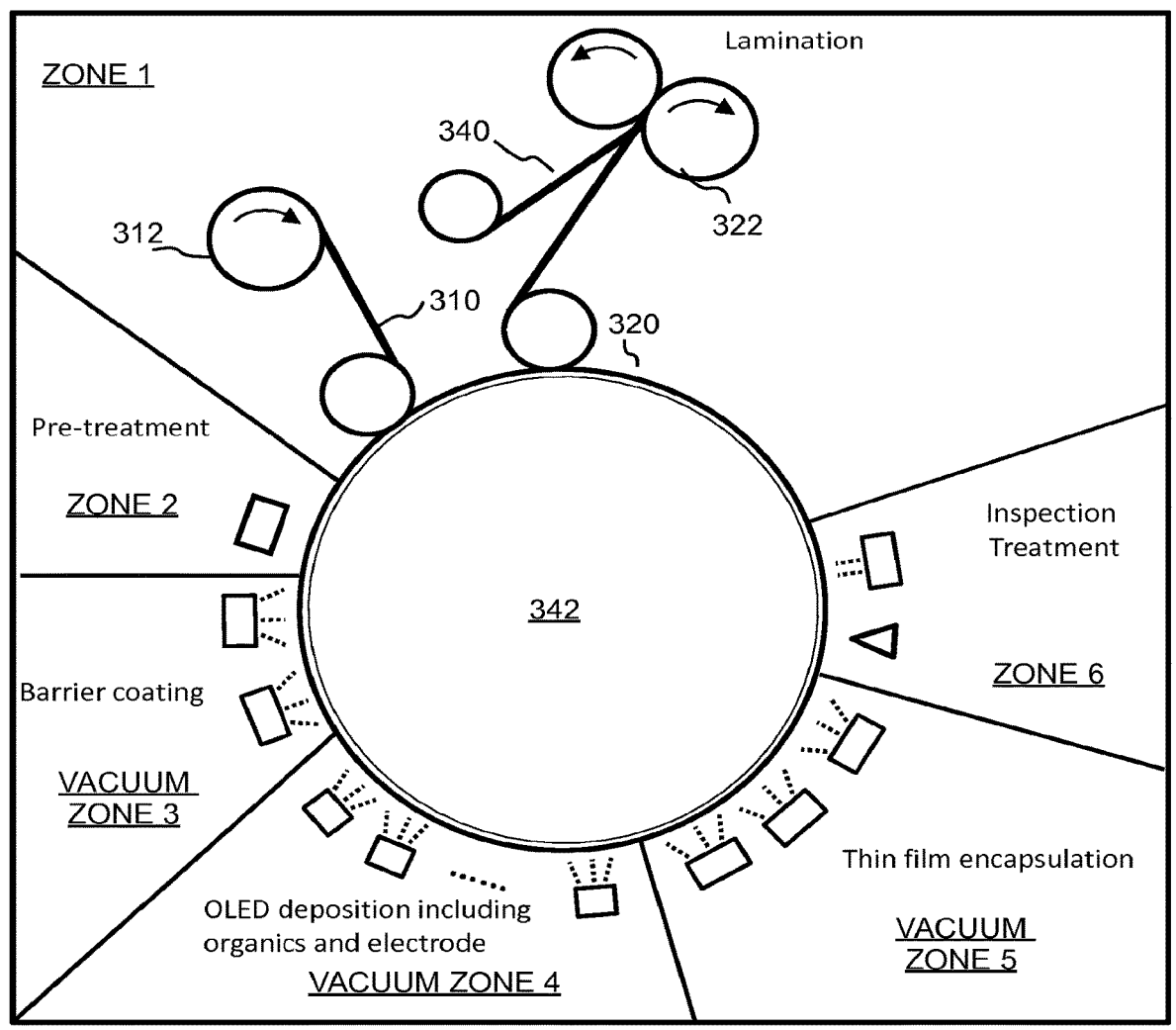
FIG. 14B illustrates the process of FIG. 14A, wherein a vertical projection of a perimeter of each of the deposition sources used in forming organic electronic devices as well as perimeters of other equipment or systems, including pretreatment equipment and/or systems in zone 2 and inspection/treatment equipment and/or systems in zone 6 do not intersect the flexible substrate.
Figure 15:
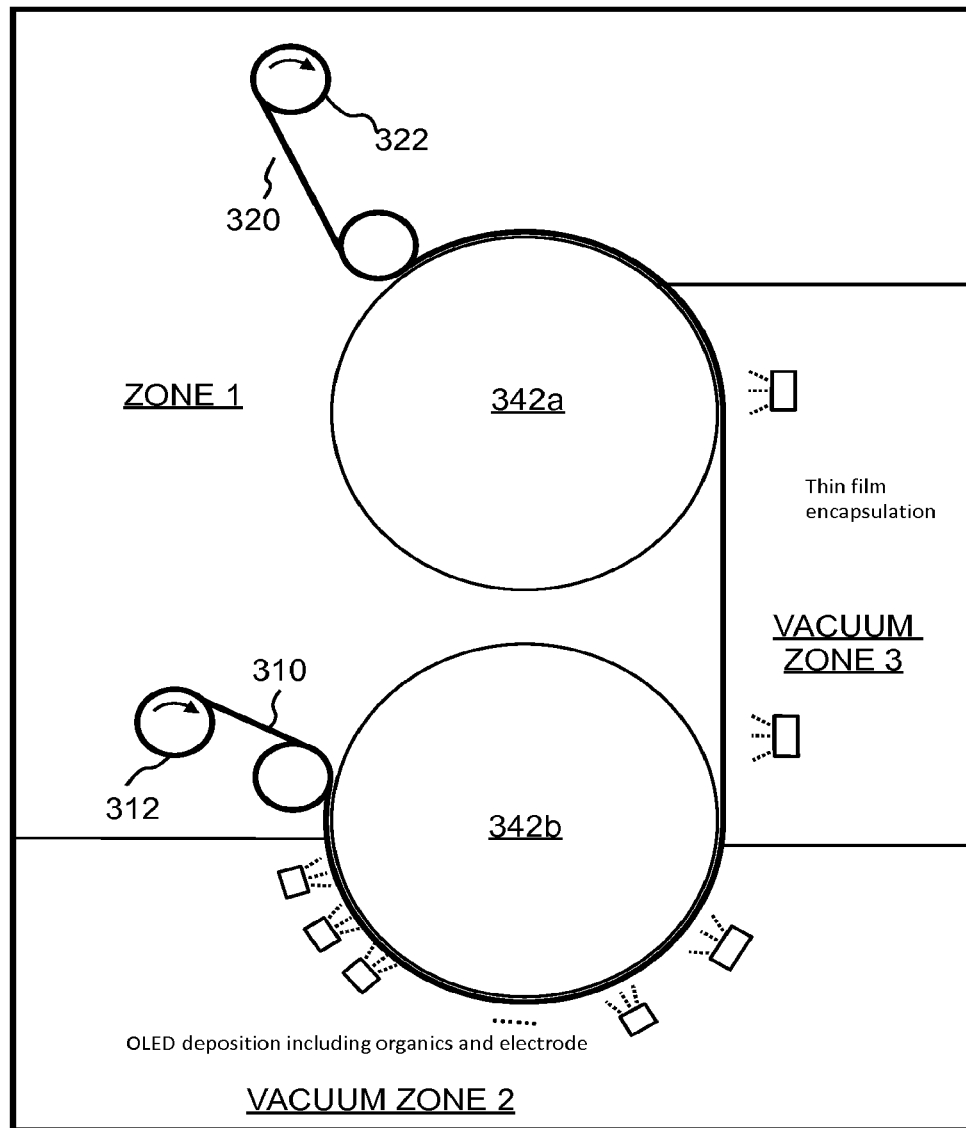
FIG. 15 illustrates a process performed around two generally circular roll coating rollers, wherein a vertical projection of a perimeter of each of the deposition sources used in forming organic electronic devices does not intersect the flexible substrate.

FIG. 11 illustrates a system including the components of the system of FIG. 10 wherein the depositions are performed around generally circular roll coating roller 342. As described above, the vertical projection of the perimeter of each the plurality of deposition sources in FIG. 11 does not intersect flexible substrate 310. This condition is not satisfied in the systems of FIGS. 1, 8 and 9, for example. FIG. 12 provides a schematic illustration of deposition sources 350a through 350h positioned around generally circular roll coating roller 342. The vertical projections of the perimeter of deposition source 350a and deposition source 350b are illustrated by dashed arrows. In FIG. 12, the vertical projection of the perimeter of deposition source 350a intersects flexible substrate 310, while the vertical projection of the perimeter of each of depositions sources 350b through 350h do not intersect flexible substrate 310. FIG. 13 illustrates an arrangement of a system similar to that shown in FIG. 8 wherein the deposition sources are arranged such that the vertical projection of the perimeter of each the deposition sources does not intersect flexible substrate 310. FIG. 14A illustrates an arrangement of a system similar to that shown in FIG. 9 wherein the deposition sources are arranged such that the vertical projection of the perimeter of each the deposition sources does not intersect flexible substrate 310. As illustrated in FIG. 14B, in a number of embodiments, other equipment and/or systems such as pre-treatment equipment or systems in zone 2 and inspection/treatment equipment or systems in zone 6 may be positioned such that the vertical projections of the perimeters thereof do not intersect flexible substrate 310 (thereby reducing the likelihood of particles being transported therefrom to the substrate or any layer deposited or otherwise formed thereon). FIG. 15 illustrates a system configuration with two main rotation cylinders 342a and 342b wherein the deposition sources are arranged such that the vertical projection of the perimeter of each the deposition sources does not intersect flexible substrate 310.

In a number of embodiments of devices, systems and methods hereof a material is deposited at less than atmospheric pressure onto a moving web or substrate (in for example, a roll-to-roll process as described above) by delivering the material into an interior of at least one cylinder. The cylinder includes at least one opening therein through which the material may pass to exit the interior of the cylinder. The cylinder is rotated so that the material passes through the opening to be deposited upon the moving web in a determined pattern. The material may, for example, be deposited at a pressure between approximately 10 to $10^{-8}$ torr. In a number of embodiments, the material is deposited at a pressure between approximately between $10^{-4}$ to $10^{-7}$ torr.

There are a number of advantages to using such a cylindrical mask for depositing and patterning on a moving substrate. For example, a cylindrical mask provides a method for depositing lines of material perpendicular to the direction of the substrate web. The width of the lines may, for example, be controlled by a combination of the width of the opening or slit in the cylinder, the speed of the cylinder rotation, the direction of the cylinder rotation and the speed of the substrate web. The spacing between the lines may, for example, be controlled by the number/spacing of openings in the cylinder and the rotational speed. Lines and/or patterns that are not perpendicular to direction of the web may also be deposited. By, for example, using more than one concentric cylinders and controlling their speed and other parameters, one may deposit not only straight lines but a design-like pattern on a substrate. Use of a cylindrical mask provides a non-contact method for depositing lines (for example, bus lines), thereby reducing particulate contamination as compared to contact methods. All material being deposited may be contained within the cylinder, thereby reducing or eliminating shielding. Moreover, the patterning features/characteristics are readily programmable.

As described above, OLED and other organic electronic devices include several layers of materials. These layers may include a bottom electrode (anode), an organic stack, and a top electrode (cathode). Typically, multiple OLED devices are formed on the substrate, which may be arranged in directions both parallel and perpendicular to the direction of motion of the substrate. This manufacturing process requires the patterning of OLEDs including electrodes and organic layers. Another feature in OLEDs is a metal bus line. For bottom emission OLED lighting panels, the anode may, for example, be made using a transparent conductor such as ITO. When the transparent conductor is used for a large area lighting panel, however, the panel often looks non-uniform. This effect is a result of the sheet resistance of the transparent conductor being significantly higher than a metal conductor. To reduce the non-uniformity, conductive bus lines (typically metal) are used over the transparent conductor to improve the conductivity of the bottom electrode.

Depositing metal bus lines 350 (see FIG. 16) in the direction of the moving substrate 310 may be done using several different methods. One method is to flash evaporate the metal material 400 under a slit or hole 420 at programmed times to produce a uniform line in the direction of the moving substrate as illustrated in FIG. 16. Another method would be to have continuous evaporation through a hole or slit to create a continuous metal line on the substrate. Multiple holes or slits may be used to create an array of bus lines on the substrate. Breaks in the line may be achieved by using a removable material attached to the substrate to mask the metal from being deposited where it is not desired.

Depositing bus lines perpendicular to a moving substrate web may, for example, be made by either flash evaporating or continuous evaporating a conductive material (metal) through a cylindrical mask onto the substrate as discussed above. As, for example, illustrated in FIG. 17A, the cylindrical mask may, for example, include a cylinder 500 which has one or more narrow slit(s) 510 therein and has, for example, an evaporative source 400 within the interior of cylinder 500. Cylinder 500 rotates around evaporative source 400. The material passes through slit 510 onto the substrate web 310 (see FIG. 17B) when slit 510 reaches a specific location during the rotation of cylinder 500. The slit location for deposition may, for example, be directly above source 400, but other locations may be used. A shield may be used to confine the evaporated source material so that it can only go certain direction e.g. upward. As described above, a combination of the width of slit 510, the speed of the cylinder rotation, the direction of the cylinder rotation and the speed of the substrate web may be used to determine the width of, for example, a bus line. The length of slit or opening 510 may, for example, go from one edge of the substrate to the other or there may be several breaks in the slit if shorter bus (or other) lines are desired. There may be multiple slits 510a (see FIG. 17B) around the circumference of a cylinder 500a to reduce the rotation speed of cylinder 500a as shown in FIG. 17B. The cylinder rotation speed may be readily programmable to provide a required distance between, for example, bus lines.

Figure 18:
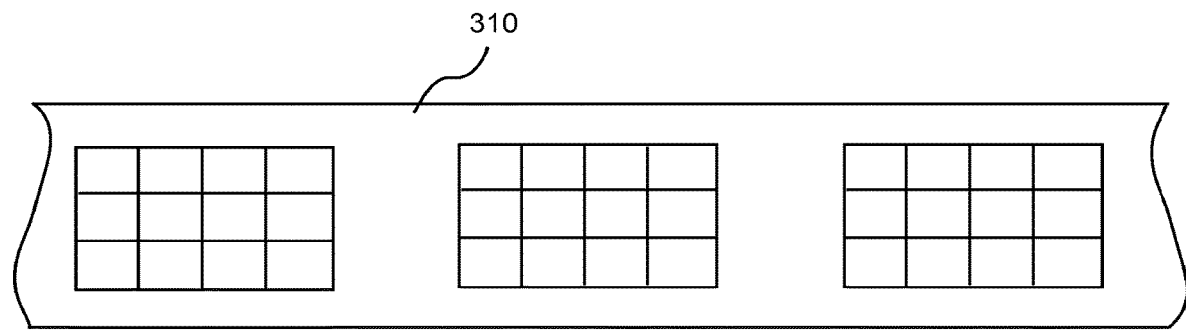
FIG. 18 illustrates an example of a repeatable grid pattern of bus lines on a substrate.

Additionally, slits in a cylindrical mask may be made that are parallel to the direction of the moving substrate to provide patterned lines in the direction of the web. Slits parallel to the moving substrate may, for example, provide a method for blocking the deposition in undesirable areas (for example, in between lighting panels). When using both the patterning method for the parallel and perpendicular bus lines, a repeatable grid pattern of bus lines may be deposited for each lighting panel as, for example, illustrated in FIG. 18.

Figure 19:
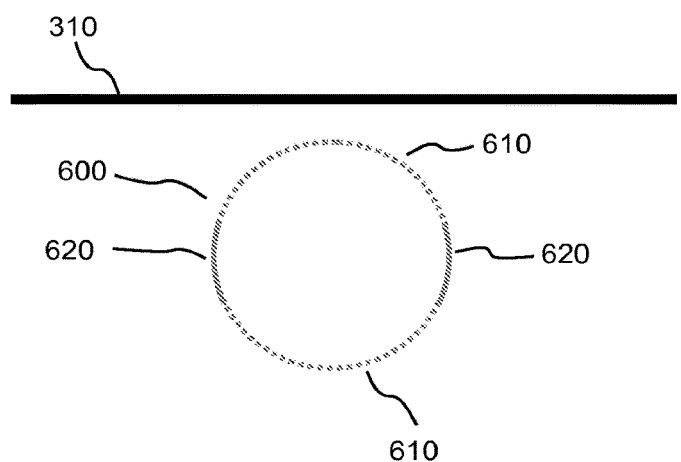
FIG. 19 illustrates schematically a process and system in which a cylindrical mask may be used for depositing organic material wherein broken lines represents open mask areas.

Another option is to have a pattern of slits or holes in the cylinder. The pattern on the substrate may, for example, have a dual function. For example, a first function may be a bus line to improve uniformity of the lighting panel. A second function may be a decorative feature (pattern) to the lighting panel. The methods described above may be also used for organic deposition, as shown, for example, in FIG. 19. In such an application, cylinder 600 may, for example, include large open areas 610 for the organic material within cylinder 600 to be deposited and smaller blocked areas 620 to prevent the organic material from being deposited onto undesirable areas, such as the contacts or between each lighting panel. This system and method reduce the requirement for masking to be applied directly to substrate 310 prior to the deposition process.

Figure 20:
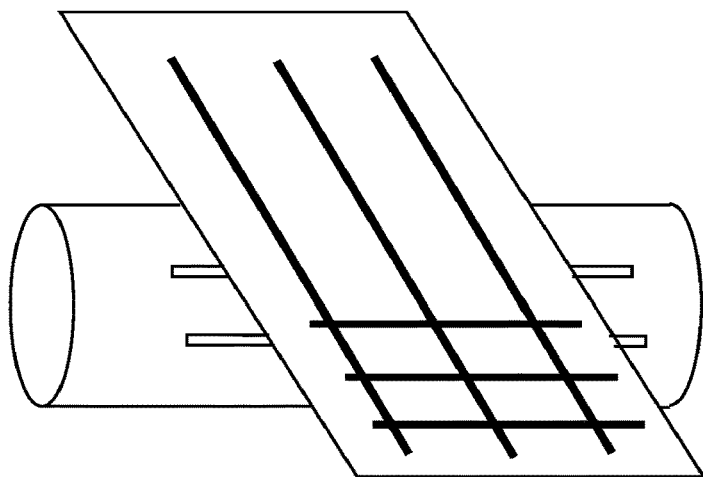
FIG. 20 illustrates schematically a process and system in which a two-dimensional pattern including both parallel lines and perpendicular lines is deposited upon a moving substrate using, for example, multiple cylinders.
Figure 21:
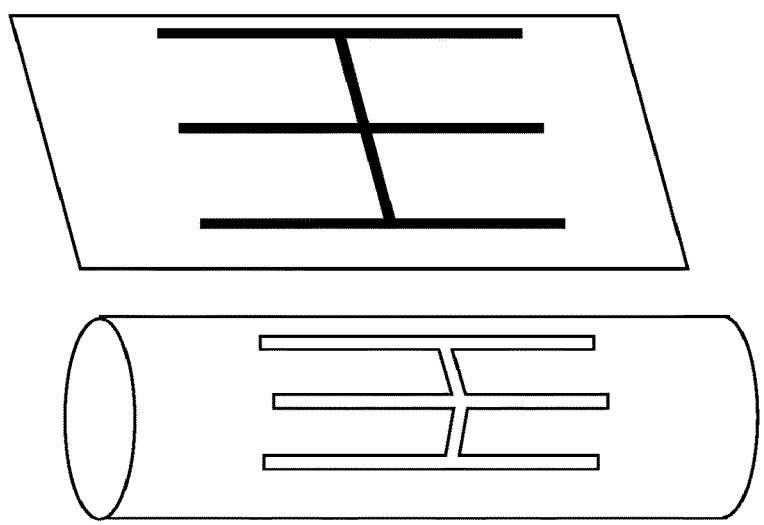
FIG. 21 illustrates schematically a process and system in which a two-dimensional pattern is deposited upon a moving substrate using a single cylinder.
Figure 22:
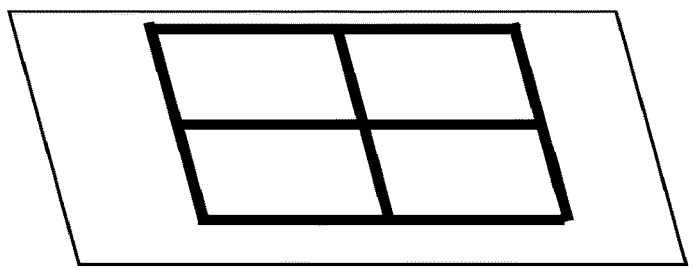
FIG. 22 illustrates schematically another process and system in which a two-dimensional pattern is deposited upon a moving substrate using a single cylinder.
Figure 22:
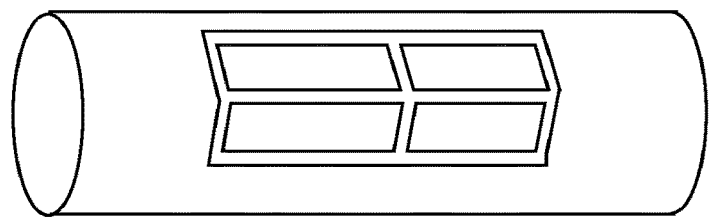

Providing a determined pattern including a two-dimensional matrix on a substrate may, for example, be accomplished in different ways. In a first method, the substrate may, for example, begin with a parallel pattern (a series of lines in the direction of the moving substrate). The parallel pattern may, for example, be deposited using a first cylindrical mask. The substrates then may pass over a cylinder wherein a perpendicular pattern (for example, a line perpendicular to the moving substrate) are deposited creating a two-dimensional matrix as illustrated in FIG. 20. In another method, a two dimensional matrix is deposited through a single cylinder at one time (that is, the pattern of openings in the cylinder forms a two-dimensional matrix). This is relatively simple when there is only one vertical or only one horizontal opening in the cylinder as illustrated in FIG. 21. When more than one vertical line and more than one horizontal line are desired, the area between the vertical and horizontal openings in the cylinder will need to be supported from inside the cylinder. The cylinder wall alone cannot support such area because the opening in the cylinder completely surrounds that area (see FIG. 22).

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method of depositing a material at less than atmospheric pressure onto a moving substrate web having a removable material attached to a surface thereof, comprising:
    delivering the material into an interior of at least a first cylinder and a second cylinder, the first cylinder comprising a first opening pattern therein and the second cylinder comprising a second opening pattern therein, wherein the first opening pattern and the second opening pattern are different, wherein the second opening pattern has a plurality of openings, and wherein the material may pass through the first opening pattern and the second opening pattern to exit the interior of the first cylinder and the second cylinder, respectively; and
    rotating the first cylinder and the second cylinder so that the material passes through the first patterned opening and the second patterned opening to be deposited upon the moving substrate web in a determined pattern that comprises a two-dimensional matrix having at least a first pattern, where one or more first lines of the material are deposited parallel to a direction of the moving substrate web, and a second pattern, where one or more second lines of the material are deposited perpendicular to the direction of the moving substrate web, wherein the removable material attached to the moving substrate web forms breaks in at least one of the first pattern and the second pattern,
    wherein the determined pattern that the material is deposited is based on the first patterned opening, the second pattern opening, a first rotational speed and a first rotational direction of the first cylinder, and a second rotational speed and a second rotational direction of the second cylinder.

2. The method of claim 1 wherein the pressure is between 10 to $10^{-8}$ torr.

3. The method of claim 1 wherein the pressure is between $10^{-4}$ to $10^{-7}$ torr.

4. The method of claim 1 wherein a source of the material is positioned within the cylinder.

5. The method of claim 1 wherein an axis of the cylinder is generally perpendicular to a direction of motion of the web.

6. The method of claim 1 wherein the speed of the web is programmable.

7. The method of claim 1 wherein the rotational speed of the cylinder is programmable.

8. The method of claim 1 wherein microelectronic systems are formed on the web.

9. The method of claim 8 wherein the material is an organic material.

10. The method of claim 8 wherein the material is a conductive material.

11. The method of claim 10 wherein the determined pattern comprises bus lines over a transparent conductor on the web.

12. The method of claim 9 wherein the material is an evaporative material.

* * * * *